United States Patent
Miles et al.

(10) Patent No.: US 6,950,305 B2
(45) Date of Patent: Sep. 27, 2005

(54) OVERMOLDED DEVICE WITH CONTOURED SURFACE

(75) Inventors: Marshall Miles, Oklahoma City, OK (US); Gary Hua, Edison, NJ (US)

(73) Assignee: Bel Fuse, Inc., Jersey City, NJ (US)

(*) Notice: Subject to any disclaimer, the term of this patent is extended or adjusted under 35 U.S.C. 154(b) by 214 days.

(21) Appl. No.: 10/438,721

(22) Filed: May 15, 2003

(65) Prior Publication Data

US 2004/0022031 A1 Feb. 5, 2004

Related U.S. Application Data

(60) Provisional application No. 60/380,897, filed on May 15, 2002.

(51) Int. Cl.$^7$ ................................................. H05K 7/20
(52) U.S. Cl. ..................... 361/690; 165/80.2; 165/80.3; 165/185; 174/16.3; 257/707; 257/713; 257/787; 361/714; 361/717; 361/718; 361/722
(58) Field of Search ............................... 165/80.2, 80.3, 165/185; 174/16.3; 257/706–707, 712–713, 787, 496, 714; 361/688–689, 690, 699, 704–722

(56) References Cited

U.S. PATENT DOCUMENTS 5,254,500 A * 10/1993 AuYeung ..................... 29/827
2002/0190396 A1 * 12/2002 Brand

FOREIGN PATENT DOCUMENTS

JP          40-4256347    *  9/1992    ................. 257/713
JP          5-47963       *  2/1993    ................. 257/713

* cited by examiner

*Primary Examiner*—Gregory Thompson
(74) *Attorney, Agent, or Firm*—Ostrolenk, Faber, Gerb & Soffen, LLP

(57) ABSTRACT

An electronic device has three dimensional surface features molded into an encapsulant forming an electronic package. The electronic package has improved heat transfer compared to conventional electronic devices. The three dimensional features are designed to be moldable.

14 Claims, 3 Drawing Sheets

OVERMOLDED DEVICE WITH CONTOURED SURFACE

RELATED APPLICATION

This application claims the benefit of U.S. Provisional Application No. 60/380,897, filed May 15, 2002, which is incorporated by reference herein in its entirety.

FIELD OF THE INVENTION

The field of the invention is electronic devices packaged by sealing in an encapsulant.

BACKGROUND OF THE INVENTION

Electronic packaging, such as shown in FIG. 1, uses moldable materials, such as epoxy resins, to encapsulate electronic components. The electronic components generate heat, which must be dissipated by the electronic packaging. Specifically, the temperature of the electronic components in an electronic device, such as shown in FIG. 1, should be kept below the maximum design temperature for each component.

SUMMARY OF THE INVENTION

An electronic device comprises electronic components, including at least one heat generating component, that are encapsulated by a moldable encapsulant. The surface area of the encapsulant is increased by molding three dimensional surface structures in the encapsulant without increasing the volume of the electronic device, for example.

Other features and advantages of the present invention will become apparent from the following description of the invention which refers to the accompanying drawings. The following drawings and detailed descriptions are included merely as examples and should not be used to limit the claims.

DETAILED DESCRIPTION OF THE PREFERRED EMBODIMENTS

In one embodiment, an electronic device comprises at least one heat generating electronic component encapsulated in a moldable encapsulant. The moldable encapsulant has three dimensional surface features molded into the surface of the package of the electronic device. Preferably, the three dimensional structures efficiently remove heat from the electronic package that is generated by the at least one heat generating electronic component. More preferably, the three dimensional surface features are adjacent to the at least one heat generating electronic component. Thus, the path for heat removal is reduced, the surface area is increased, and the temperature of the heat generating component is reduced by improved heat transfer compared to prior art electronic packaging.

Figure 2:
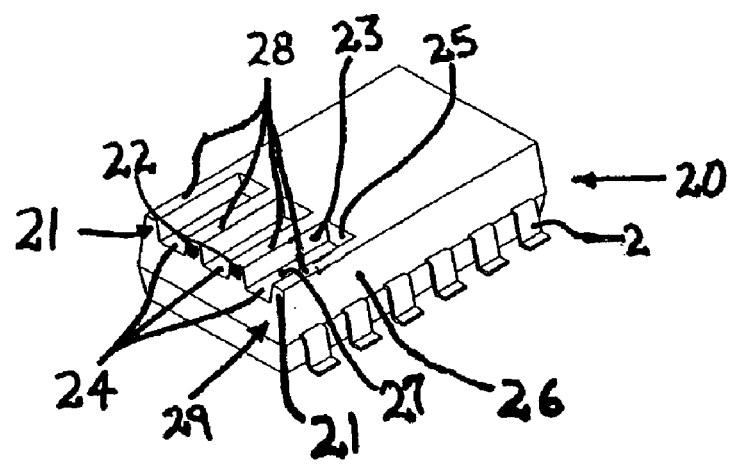
FIG. 2 shows one embodiment of the present invention.
Figure 3:
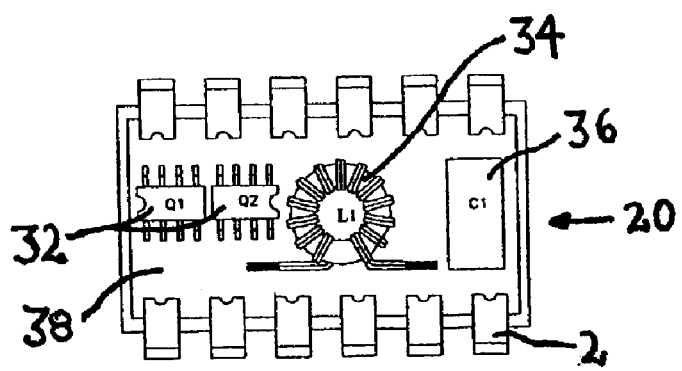
FIG. 3 shows a printed circuit board of one embodiment prior to encapsulation, revealing electronic components.

For example, FIGS. 2 and 3 show embodiments of the present invention, having fins 21 molded in at least one surface of the electronic package 20. Preferably, the fins 21 are molded in the surface opposite of the electrical connectors 22, whereby air circulating over the electronic package 20 helps to cool the fins 21 by convective heat transfer.

Figure 4:
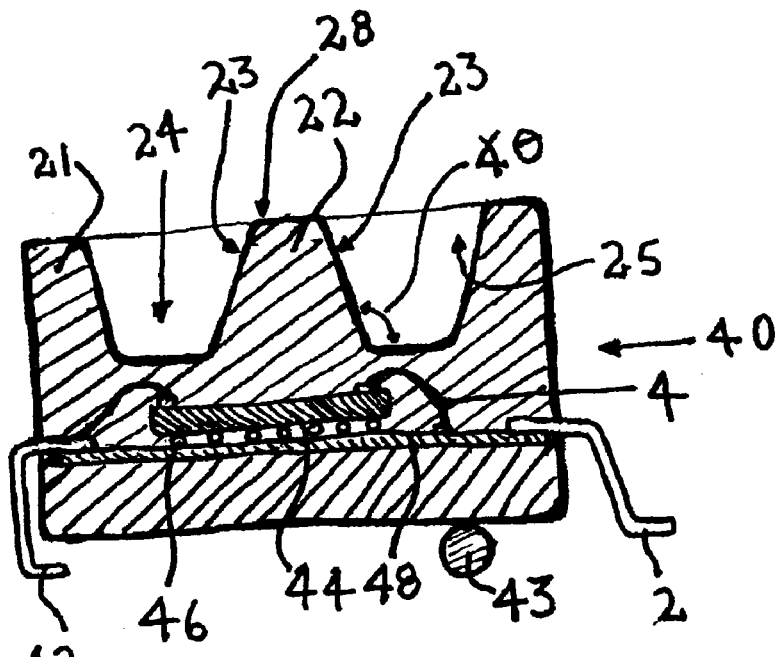
FIG. 4 shows a cross-sectional view of another embodiment of the invention.

In one embodiment, the three dimensional surface features are located directly above at least one heat generating electronic component 44, 32. FIG. 4 shows a cross-section of one embodiment having a thermally conductive fin 22 positioned directly above the heat generating electronic component 44. Also, FIG. 4 shows that the fin 22 has side walls 23, which meet a lower surface 24 at angle θ, which is preferably greater than 90°. Having an angle θ greater than 90° allows the electronic package to be released from the mold, following the operation of molding of the encapsulant, without damage to the electronic package, both reducing cost and increasing performance compared to electronic packages subject to damage.

Alternatively, the angle θ is used to ensure contact with a chill (not shown), if a chill is inserted into the three dimensional surface structure. For example, a copper chill plate may be contoured to fit into the three dimensional surface features to improve thermal heat dissipation from the electronic package.

Figure 5:
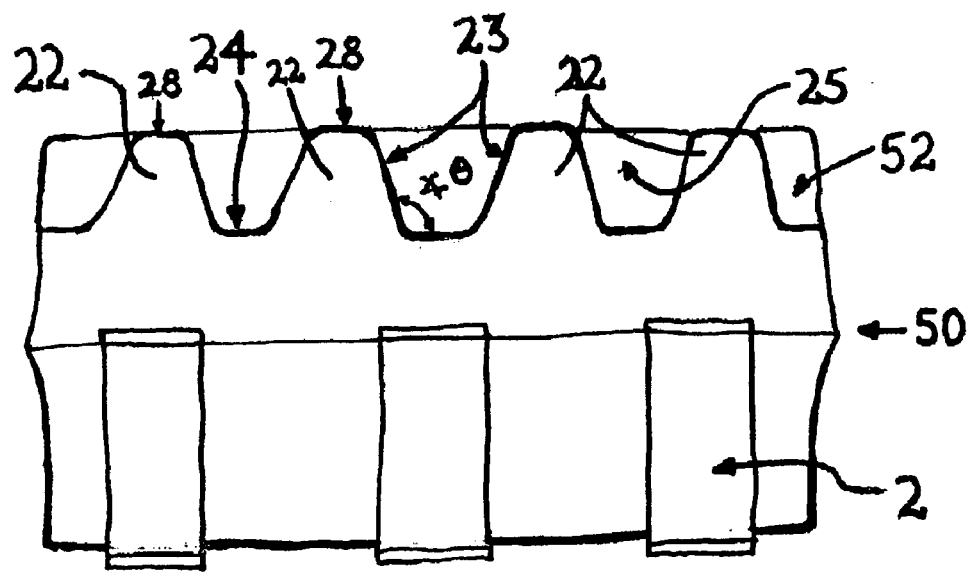
FIG. 5 shows an alternative embodiment of the invention.

FIG. 5 shows an alternative embodiment having an indentation 52 at the external periphery of the electronic package 50 instead of having a peripheral fin 29 at that position, as shown in FIG. 2. Also, the fins in FIG. 5 are shown as perpendicular, instead of parallel, to the side of the electronic package having the electrical connectors 2.

Figure 6:
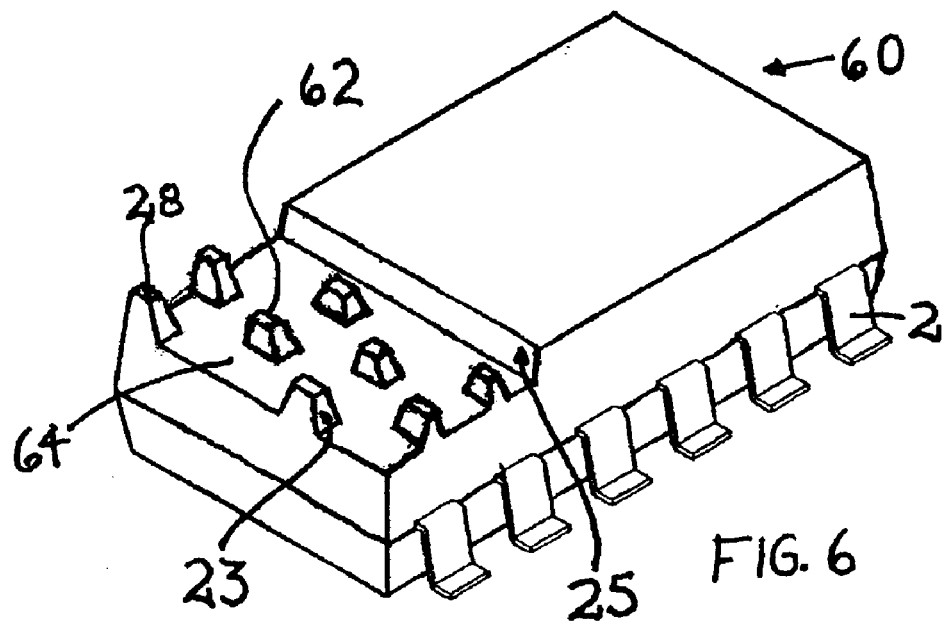
FIG. 6 shows yet another embodiment of the invention.
Figure 7:
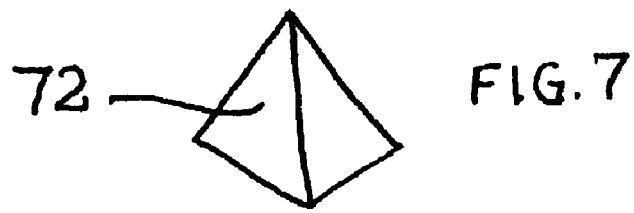
FIG. 7 shows on alternative pyramidal pin.
Figure 8:
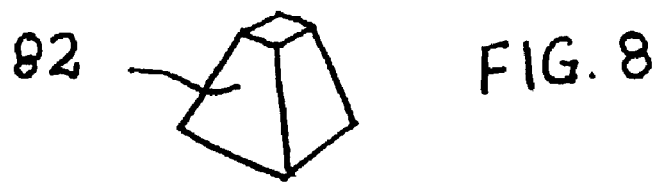
FIG. 8 shows another alternative pyramidal pin.
Figure 9:
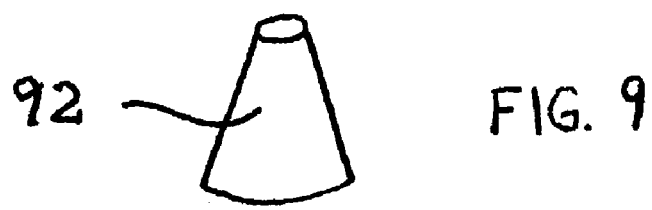
FIG. 9 shows one alternative pin having a conical shape.

FIG. 6 shows another embodiment of the invention comprising a three dimensional pattern of pins 62 molded on at least one surface of electronic package 60. Preferably, the pins are formed over the heat generating electronic components, reducing the thermal resistance of the electronic package 60. As shown in FIG. 6, the molding process creates indentations having a continuous lower surface 64 isolating pins 62. Three dimensional surface structures such as pins and fins may be arranged in any orientation and geometry, and the three dimensional surface morphology acts to reduce the thermal resistance and increase the surface area of the electronic package in an area requiring heat removal. It is believed, without being limiting in any way, that the increase in surface area increases the rate of convective heat transfer or heat transfer to a chill plate.

For example, the morphology and density of the pins 62, 72, 82, 92 and fins 21, 22 can be optimized using conventional software algorithms designed to model conductive and/or convective heat transfer. Preferably, the morphology of the three dimensional surface features are designed to be moldable. For example, moldable three dimensional surface features have surfaces that avoid reentrant angles where the vertical wall meets the lower surface of the electronic package, and the angles between top, side and bottom surfaces are radiused or tapered rather than sharp, as shown in FIGS. 4 and 5, for example.

Figure 1:
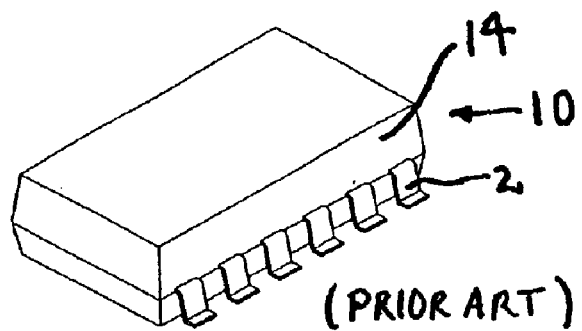
FIG. 1 shows a conventional overmolded device of the prior art.

Referring now to FIG. 2, an electronic package 20 has three indentations 24 molded into one surface of a moldable encapsulant that forms an exterior surface of the electronic package 20. The indentations and the exterior surface of the encapsulant surrounding the three indentations 24 defines two interior fins 22 and two exterior fins 21. Each of the fins 21, 22 has a sidewall 23 between an upper surface 28 and a lower surface defined by the indentation 24. Preferably, the fins 21, 22 extend from one end of the electronic package 29, over heat generating electronic devices, for example, power electronic devices 32, ending at an end wall 25. Fins 21, 22 may extend across the width of the electronic package or the length of the electronic package; however, tall components that produce less heat 34, 36 are preferably covered by encapsulant having no three dimensional surface features. By covering tall components 34, 36 that produce no or little heat with encapsulant having a flat surface, the size of the electronic package 20 has the same external surface dimensions as conventional electronic packages, as shown in FIG. 1. This is advantageous for replacement devices that require minimal process re-engineering.

In FIG. 3, the heat generating components 32 are located under indentations 24 of FIG. 2, for example. Thus, the distance for heat to travel from the electronic components 32 to the lower surface of the indentations 24 is reduced compared to the conventional package of FIG. 1. Therefore, thermal resistance of the package is also reduced, and the temperature of the electronic components 32 are thereby reduced. Furthermore, the fins 21, 22 increase the surface area of the package, improving convective heat transfer, for example.

The indentations are positioned over heat generating components, but are not positioned over taller components that produce less heat than the heat-generating components or negligible amounts of heat. Thus, the three dimensional surface features, such as fins 21, 22 and pins 62, 72, 82, 92, increase the surface area in the location requiring greatest heat transfer. The indentations also save overmolding encapsulants, reducing the weight and cost of the electronic devices. The height of at least one of the taller components is taller than the lower surface of at least one of the indentations.

Referring now to FIG. 5, two MOSFETs 32 are shown as examples of heat generating electronic devices. An inductor 34 and a capacitor 36 are shown as examples of electronic devices generating less heat. All of the devices are positioned on a printed circuit board and connected in an electronic circuit. Fins 21, 22 and/or pins 62, 72, 82, 92 are positioned over the MOSFETs but are not positioned over the taller inductor 34 and capacitor 36. The electronic components are connected, for example, by electrical edge connectors, as shown by MOSFETs 32 in FIG. 3 and/or by wire bonds 4 and/or ball grid arrays 46, as shown in FIG. 4, to wire traces (not shown) on the printed circuit board 48, 38.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An electronic device comprises at least one high heat generating electronic component and at least one low heat generating electronic component; at least one surface mountable electrical connection electrically connected to the at least one high heat generating electronic component; and a moldable encapsulant sealing the at least one high heat generating component and the at least one low heat generating electronic component within an electronic package, wherein at least a portion of the at least one electrical connection extends outside of the electronic package and the encapsulant has at least one surface that has at least one indentation defining a plurality of three dimensional surface features, each of the surface features being defined by the at least one indentation and an exterior surface of the electronic package and wherein the at least one high heat generating component is adjacent to the at least one indentation, and the at least one low electronic component is not adjacent to the at least one indentation.

2. The electronic device of claim 1, wherein the at least one indentation comprises a trough having two side walls meeting a lower surface at an angle greater than 90° to the lower surface and at least one end wall positioned between the two side walls and meeting both the lower surface and the two side walls at an angle greater than 90°.

3. The electronic device of claim 2, wherein the trough extends from a single end wall to an opening on the external surface of the electronic package.

4. The electronic device of claim 1, wherein the at least one indentation forms a continuous lower surface defining a plurality of isolated three dimensional surface features.

5. The electronic device of claim 4, wherein the plurality of isolated three dimensional surface features are pins.

6. The electronic device of claim 4, wherein the isolated three dimensional surface features are pyramidal pins having a wider base than a tip.

7. The electronic device of claim 4, wherein the isolated three dimensional surface features are conical pins having a larger base radius than a tip radius.

8. An electronic device comprising a printed circuit board having at least one heat generating electronic component and at least one tall electronic component, taller than the at least one heat generating component, and the at least one tall electronic component generates less heat than the at least one heat generating electronic component, at least one surface mountable electrical connection electrically connected to the at least one heat generating electronic component; and a moldable encapsulant sealing the at least one heat generating component within an electronic package, wherein at least a portion of the at least one electrical connector extends outside of the electronic package and the encapsulant has at least one surface that has at least one indentation defining a plurality of three dimensional surface features, each of the surface features being defined by the at least one indentation and an exterior surface of the electronic package, wherein the at least one tall electronic component and the at least one heat generating component are positioned on the printed circuit board such that at least a portion of the at least one heat generating component is adjacent to the at least one indentation, and the at least one tall electronic component is not under the at least one indentation, is taller than the lower surface of the at least one indentation, and is sealed within the encapsulant.

9. The electronic device of claim 8, wherein the at least one heat generating electronic component comprises two MOSFETs.

10. The electronic device of claim 9, wherein the at least one tall electronic component comprises an inductor.

11. The electronic device of claim 3, wherein the at least one indentation is two indentations, defining three fins.

12. The electronic device of claim 3, wherein the at least one indentation is three indentations, defining four fins.

13. The electronic device of claim 12, wherein the four fins consist of two outer fins, each defined by the exterior surface of the encapsulant and one of the three indentations and two inner fins, each defined by two of the three indentations that are adjacent and an upper surface of each of the two inner fins defined by the exterior surface of the encapsulant.

14. The electronic device of claim 13, wherein the width and position of each of the two inner fins are selected to optimize the heat transfer from the at least one heat generating component.

* * * * *